(12) United States Patent
Schneider et al.

(10) Patent No.: US 7,936,628 B2
(45) Date of Patent: May 3, 2011

(54) SEMICONDUCTOR MEMORY AND METHOD FOR OPERATING A SEMICONDUCTOR MEMORY

(75) Inventors: Helmut Schneider, Munich (DE); Roland Thewes, Groebenzell (DE)

(73) Assignee: Qimonda AG, Munich (DE)

( * ) Notice: Subject to any disclaimer, the term of this patent is extended or adjusted under 35 U.S.C. 154(b) by 423 days.

(21) Appl. No.: 12/186,085

(22) Filed: Aug. 5, 2008

(65) Prior Publication Data

US 2009/0040803 A1    Feb. 12, 2009

(30) Foreign Application Priority Data

Aug. 6, 2007  (DE) .......................... 10 2007 036 983

(51) Int. Cl.
*G11C 7/02* (2006.01)
(52) U.S. Cl. ........................ 365/210; 365/207
(58) Field of Classification Search .................. 365/210, 365/207, 51
See application file for complete search history.

(56) References Cited

U.S. PATENT DOCUMENTS

| | | | | |
|---|---|---|---|---|
| 5,072,425 A | * | 12/1991 | Kohno et al. | 365/226 |
| 5,418,750 A | * | 5/1995 | Shiratake et al. | 365/206 |
| 7,133,321 B2 | * | 11/2006 | Jung | 365/202 |
| 7,200,029 B2 | * | 4/2007 | Yoshioka | 365/145 |
| 2003/0099125 A1 | | 5/2003 | Kang | |

OTHER PUBLICATIONS

Cappelletti et al., "Flash Memories" (1999), pp. 292-305, published by Kluwer Academic Publishers.

* cited by examiner

*Primary Examiner* — Anh Phung
(74) *Attorney, Agent, or Firm* — John S. Economou

(57) ABSTRACT

A semiconductor memory having read amplifier strips having a plurality of read amplifiers and having memory cell fields which have a plurality of memory cells connected to bit lines is disclosed. The read amplifier strips include at least two outer read amplifier strips between which the remaining read amplifier strips and the memory cell fields are arranged, wherein adjacent to at least one of the outer read amplifier strips, a reference circuit field is arranged, which has reference lines and reference circuit elements connected thereto, and wherein the reference lines are shorter than the bit lines of the memory cell fields.

38 Claims, 6 Drawing Sheets

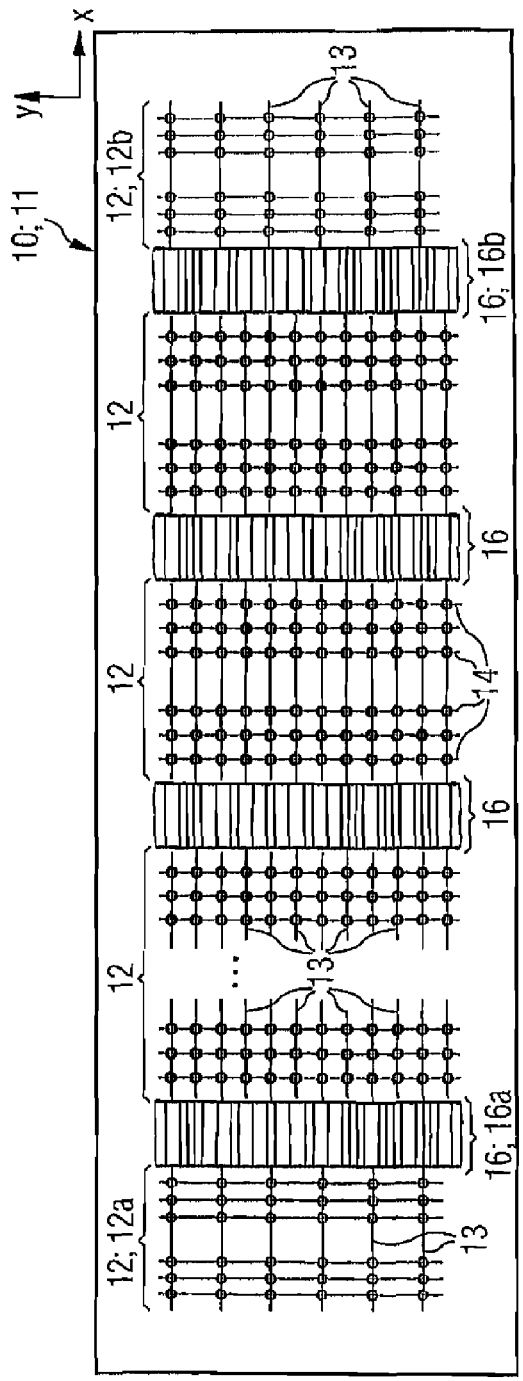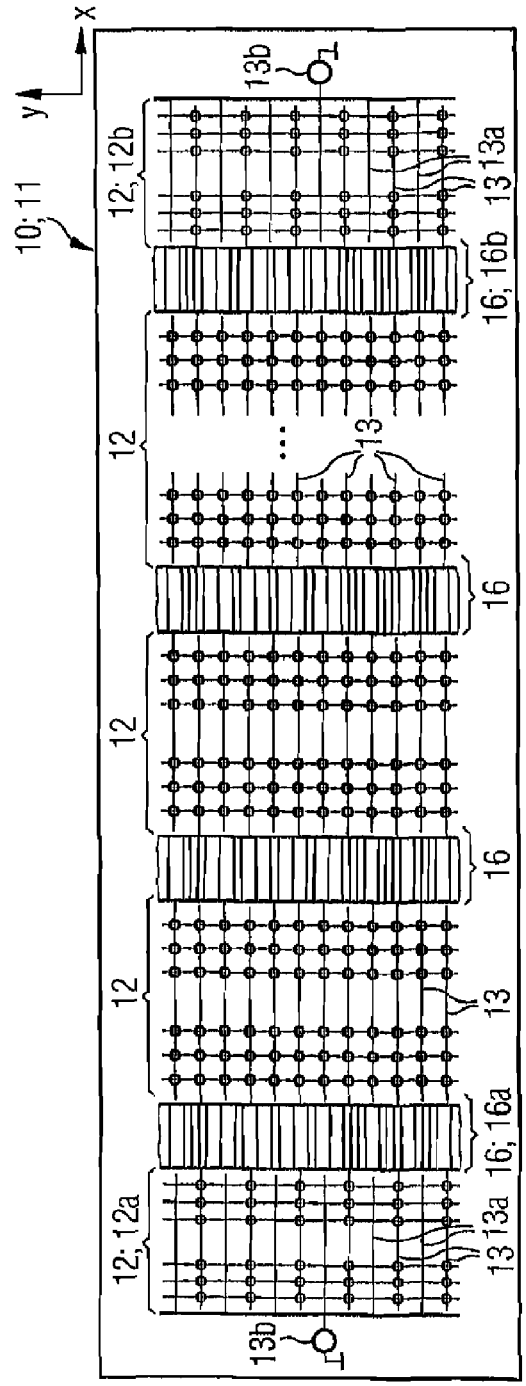

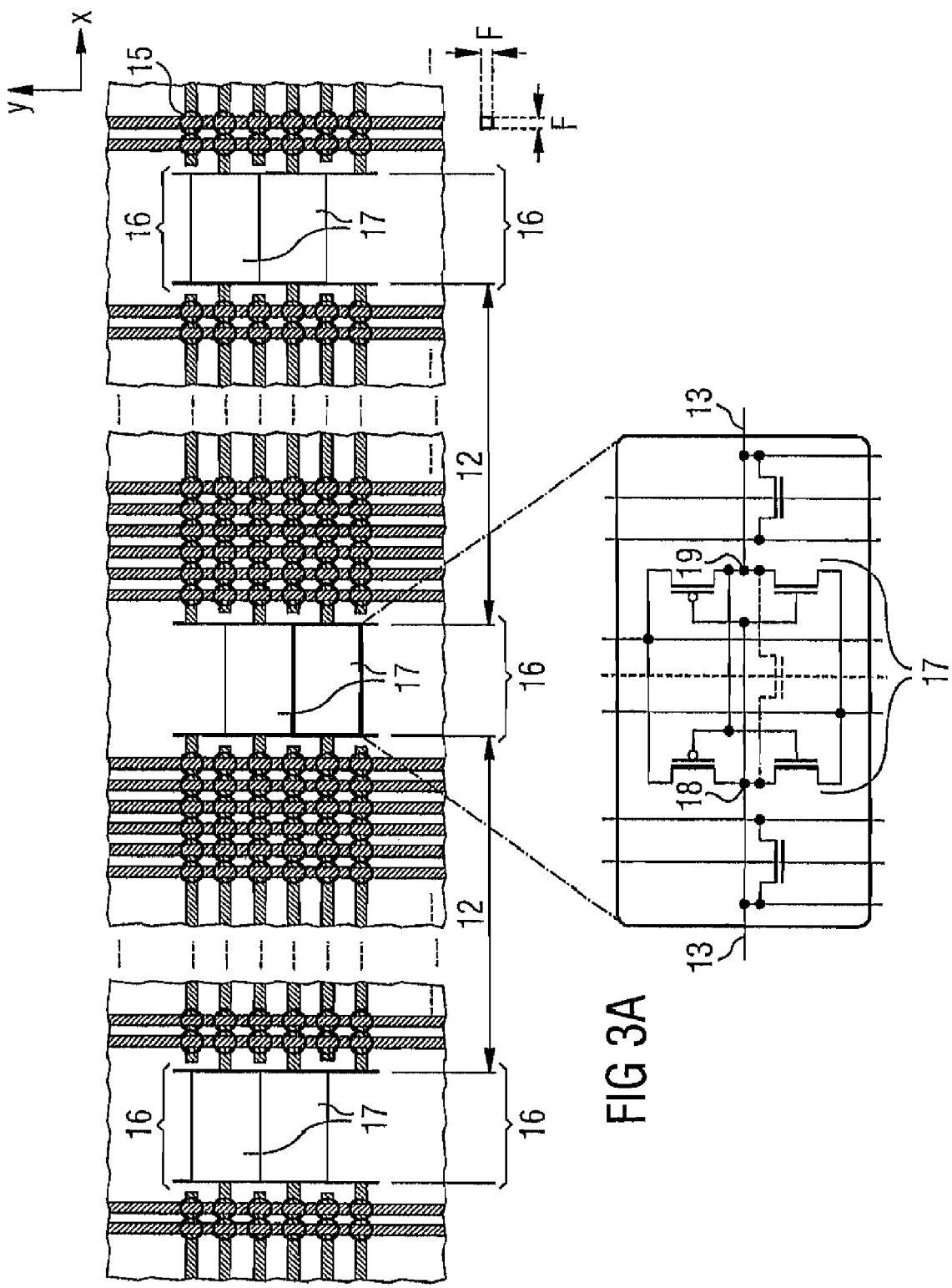

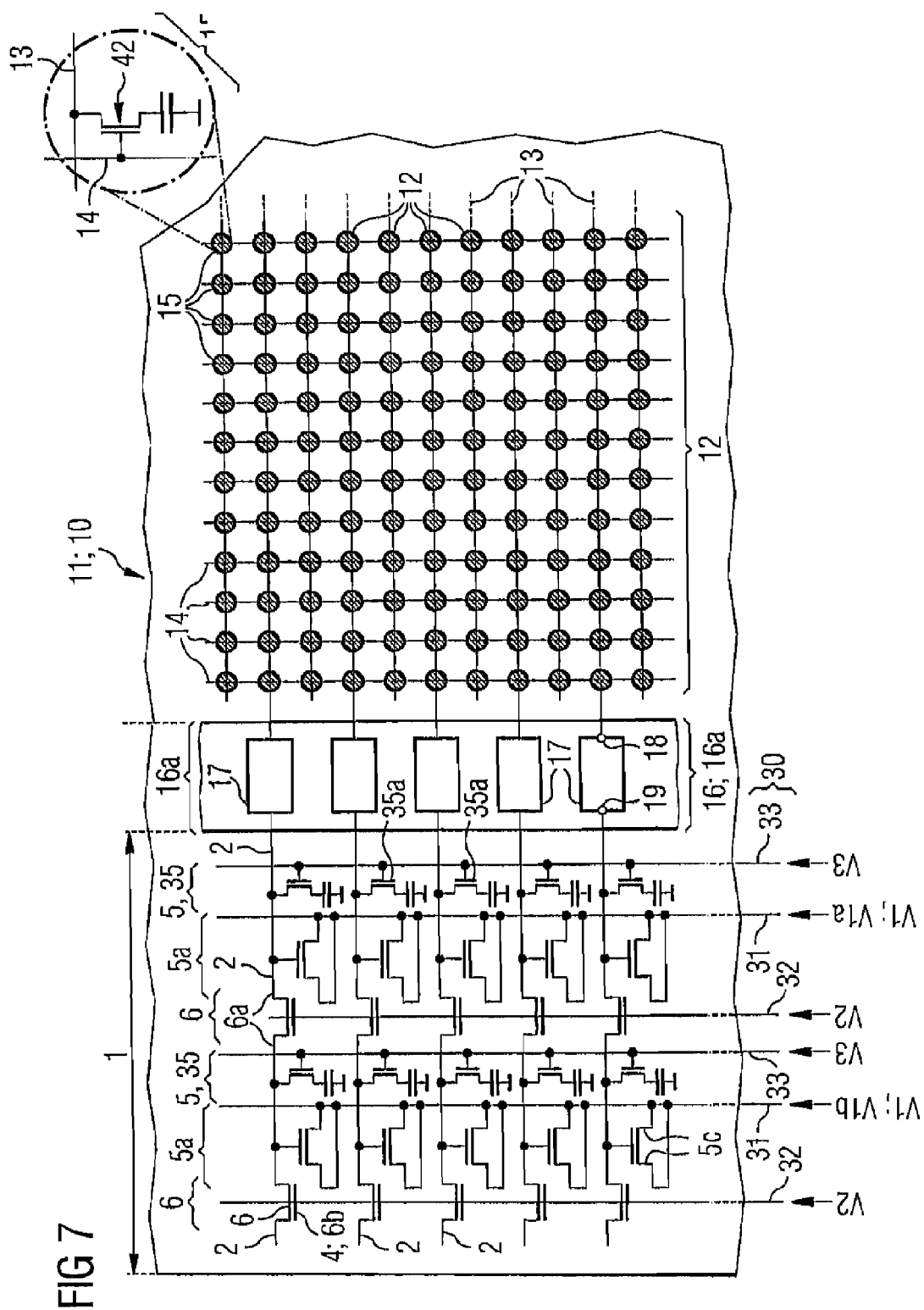

SEMICONDUCTOR MEMORY AND METHOD FOR OPERATING A SEMICONDUCTOR MEMORY

This application claims priority to German Patent Application 10 2007 036 983.4, which was filed Aug. 6, 2007 and is incorporated herein by reference.

TECHNICAL FIELD

In semiconductor technology, microelectronic circuits and/or integrated circuit devices, e.g., semiconductor memories, are manufactured, which comprise readable memory cell fields and reference memory cell fields. At the same time, a reduction of the chip area consumption is aimed for.

Presently, some embodiments according to the independent claims are provided. Further embodiments are described in the sub-claims and in the description and in the figures.

BRIEF DESCRIPTION OF THE DRAWINGS

Some embodiments are explained in the following with reference to the drawings, in which:

FIG. 1 shows a semiconductor memory having memory cell fields on both sides of each outermost read amplifier strip;

FIG. 2 shows a further semiconductor memory having dummy bit lines that may be biased, in addition to the bit lines of the outermost memory cell fields;

FIG. 3 shows an enlarged detailed view of memory cell fields and read amplifier strips of a semiconductor memory;

FIG. 3A shows a sectional enlargement of FIG. 3;

FIG. 7 shows a fourth embodiment of a semiconductor memory according to a further embodiment.

DETAILED DESCRIPTION OF ILLUSTRATIVE EMBODIMENTS

Figure 4:
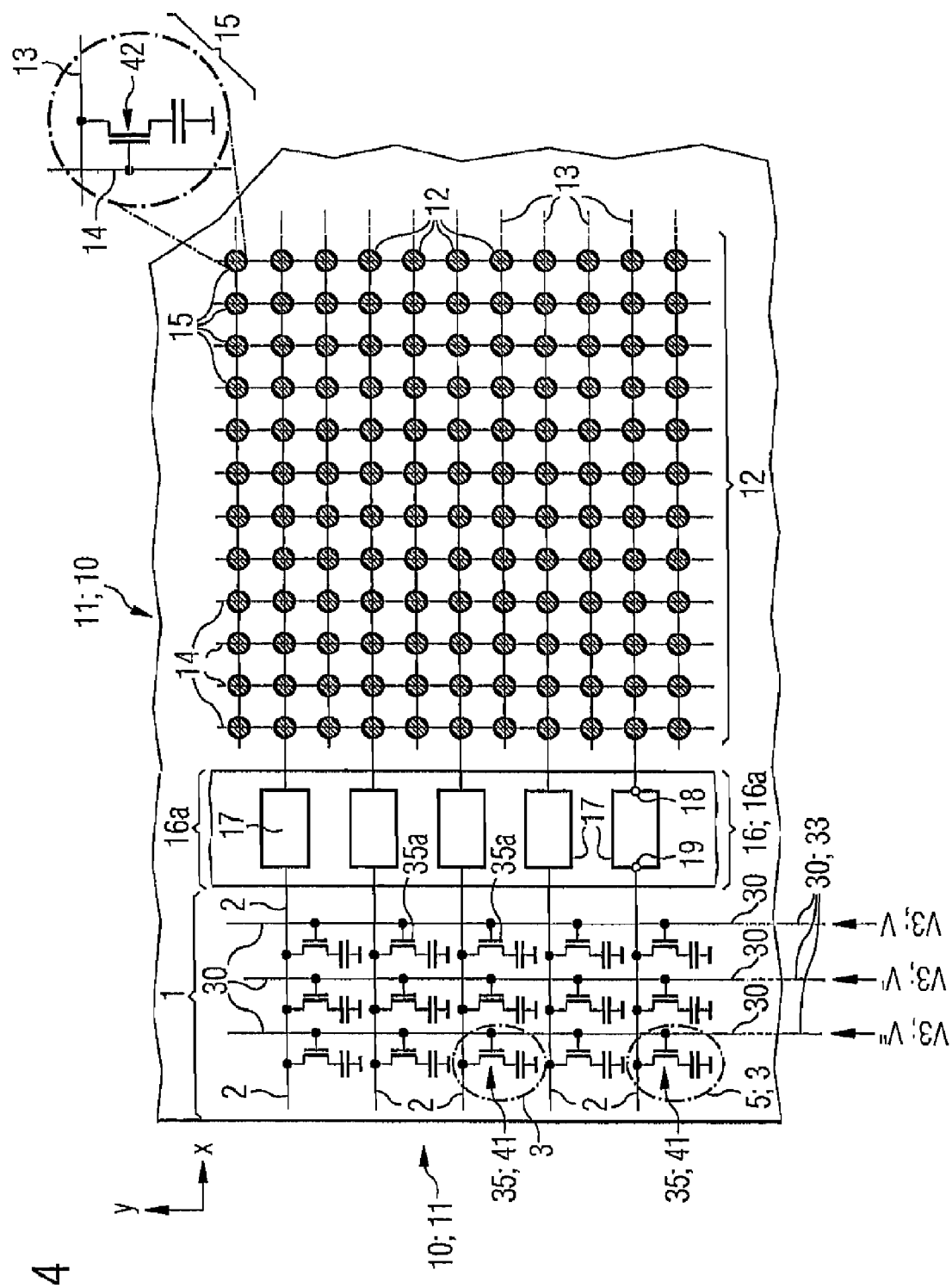
FIG. 4 shows a first embodiment of a semiconductor memory according to one implementation.

Volatile semiconductor memories, for example, volatile semiconductor memories like DRAMs (dynamic random access memories) have a memory area and a logic area for controlling the memory area. In the memory area, memory cells are arranged, which are connected to two types of conductive traces, generally bit lines and word lines, and may be controlled, in particular, programmed, deleted and/or read out via the same. Volatile semiconductor memories, for example, DRAMs, during the complete duration of storage, necessitate applying the operating voltage and in addition to that, also a repeated refreshing of the memory cells, so that the memory contents do not get lost. For this purpose, the memory cells are set up in an easy and space-saving way; with a DRAM, for example, they contain a memory capacitance, for example, a trench capacitor or a stack capacitor, and a selection transistor. The selection transistor generally is a MOSFET (metal oxide semiconductor field-effect transistor), whose first source/drain area is connected to a bit line, whose second source/drain area is connected to a capacitor electrode of the memory capacitor and whose gate electrode is connected to the word line.

The internal setup of the memory area of a semiconductor memory is relatively complex and contains a plurality of sub-units in which smaller memory cell fields and sequences of several memory cell fields are arranged, wherein in each memory cell field (as the term is used in this application), exactly one matrix-like arrangement of bit lines and word lines is present, which at the same time predetermines a matrix of the arrangement of the memory cells connected thereto. For example, the bit lines run along a first direction and the word line along another, second direction, which is, for example, perpendicular to the bit lines. In the wider sense, here the term memory cell field relates to any sub-unit in which bit lines and word lines cross each other, in the narrower sense the term memory cell field designates those sub-units of the memory area whose dimension is given by the length of a group of bit lines and a group of word lines. Thus, for example, the extension of a memory cell field is given by the bit line length and the word line length; the area content of the memory cell field thus corresponds to the product of both conductive trace lengths. Thus, each word line extends across the complete dimension of the respective memory cell field along the second direction; analog to that, each bit line of the corresponding memory cell field passes through the dimension of the memory cell field along the first direction.

Semiconductor memories, for example, DRAMs, have a plurality of sub-units, in which a lineup of alternating memory cell fields arranged next to each other and read amplifier strips arranged in between the same are arranged. Each read amplifier strip contains a plurality of read amplifiers which each serve for reading out memory cells which are connected to two conductive traces, whose potentials are compared to each other by the read amplifier, wherein the read amplifier amplifies a recognized potential difference and writes the same back in an amplified way. Hitherto, only bit lines have been connected to a read amplifier. Depending on the fact at which of the two bit lines currently a memory cell is read out or otherwise controlled, the corresponding bit line is referred to as the active bit line and the respective other bit line is referred to as the complementary bit line.

For example, along a first direction, in an alternating way, a memory cell field, a read amplifier strip, a memory cell field, a read amplifier strip, etc., are arranged. In each read amplifier the read amplifiers are lined up along the second direction. With the open bit line concept, in which the bit lines to be read out and to be spread by the read amplifier to which they are connected lead away from the read amplifier in opposite directions, the two bit lines connected to a respective read amplifier belong to two different memory cell fields which are arranged at both sides of the corresponding read amplifier strip. Accordingly, in each memory cell field the bit lines are alternatingly connected to read amplifiers of the one read amplifier strip on the one side of the memory cell field and read amplifiers of the other read amplifier strip on the other, opposing side of the memory cell field. The second lines, for example, the word lines, are routed in parallel to the main extension direction of the read amplifier strip.

If, in the above-described way, an arrangement of alternatingly successive memory cell fields and read amplifier strips in a semiconductor memory is provided, then there are two outermost read amplifier strips and/or two outermost memory cell fields along a predetermined direction, in between which, the remaining read amplifier strips and/or memory cell fields of the lined up sequence of memory cell fields and read amplifier strips are located. As the read amplifiers for reading out a bit line need a further bit line also in the outer two read amplifier strips, wherein the same has to be located in a further memory cell field arranged on the opposite side, hitherto also the two outermost read amplifier strips are surrounded by respective memory cell fields on both sides. In the two outermost memory cell fields, however, the density and the number of bit lines is only half as high, as on the outward facing side where there is no further read amplifier strip arranged anymore. Only half of the bit lines of the outermost memory cell fields are connected to a read amplifier, the remaining bit lines end at the outermost edge of the lineup of alternatingly arranged memory cell fields and read amplifier strips and are dummy bit lines.

The implementation of the outermost memory cell fields, in particular with an identical bit line length as in the controllable memory cell fields, and the maintenance of an identical number of memory cells per bit line is also needed in the outermost memory cell fields, to guarantee a symmetry between the two sides of the read amplifier of the respective outermost read amplifier strip, which enables a reliable read out and comparison of potentials of two bit lines. For this reason, the outermost memory cell fields are of the same size as the remaining, middle memory cell fields. The outermost memory cell fields, however, only store half as many data bits per substrate area and thus increase the area consumption of the semiconductor memory.

The area consumption of the semiconductor memory could be further reduced if an assembly and a mode of operation were provided in which, for each substrate area, a greater number of controllable memory cells was available, i.e., which may be used for storing and/or reading out information (i.e., wherein the memory cell density is even higher).

FIG. 1 shows a semiconductor memory in a schematic plane view onto a section of the memory area. The illustrated section of the memory area 11 of the semiconductor memory 10 shows four read amplifiers 16, including two outer read amplifier strips 16a, 16b, and a plurality of memory cell fields 12 including two outer memory cell fields 12a, 12b. In the memory cell fields 12, the bit lines 13 run along a first lateral direction x and the word lines 14 along a second lateral direction y. At the crossing points memory cells are illustrated schematically. In the read amplifier strips 16 a plurality of read amplifiers each are arranged which are lined up next to each other along the second direction y, and which are not individually illustrated in FIG. 1. As it may be seen in FIG. 1, in the illustrated section of the memory area 11 a sequence of memory cell fields 12 and read amplifier strips 16 arranged along the first direction x is arranged, wherein the read amplifier strips and memory cell fields alternate along the direction x. Thus, each read amplifier strip 16 is surrounded by two memory cell fields 12, and vice versa each memory cell field 12 is surrounded by two read amplifier strips. This does not apply to the two outermost memory cell fields 12a, 12b, however. At the edge of the memory area 11 or at the edge of a sub-unit of the memory area 11, the arrangement running along the direction x either has to end with a memory cell field 12 or a read amplifier strip. Hitherto, as illustrated in FIG. 1, such lineups of memory cell fields and read amplifier strips on both ends end with a respective outer memory cell field 12a, 12b, wherein only half of all provided bit lines 13 are connected to a respective read amplifier, because at least on one side along the direction x no further read amplifier strip follows anymore. In FIG. 1, thus in the outer memory cell fields 12a, 12b only the bit lines connected to the adjacent read amplifier strips are illustrated; the remaining bit lines in between are presented but have no technical function, however. Thus, also the two outer read amplifier strips 16a, 16b are surrounded on both sides by memory cell fields. According to the open bit line concept, the read amplifier strips are implemented so that each read amplifier controls two bit lines, which lead away from the respective read amplifier in opposing direction, i.e., in one of the two adjacent memory cell fields each. Thus, at each read amplifier of the read amplifier strips 16a, 16b exactly one bit line of one of the outer memory cell fields 12a, 12b is connected and serves at least as a complementary bit line, in general, however, also as an activable bit line for reading out the memory information of the memory cell fields 12a, 12b. FIG. 1 shows, that in case of a number of N read amplifier strips 16, all in all, N+1 memory cell fields 12 are needed. Since, however, the outer memory cell fields 12a, 12b can only store half the number of memory information as compared to the remaining memory cell fields but need the same area, an increased substrate area requirement results.

FIG. 2 shows another semiconductor memory, wherein in the outer memory cell fields 12a, 12b the additional dummy bit lines 13a (now also illustrated in the drawings), which are arranged between the bit lines 13 used for reading out, are connected to a bias terminal (13b) via which they may be biased with a neutral potential, for example, a precharge potential. By this, in the surroundings of the memory cells of the outer memory cell fields 12a, 12b an environment is provided which is as identical as possible to the remaining memory cell fields 12 between the read amplifier strips 16. However, the disadvantage still remains, that in the outer memory cell fields 12a, 12b, only half the number of information may be stored with an unchanged substrate area per memory cell field.

FIG. 3A shows an enlarged detailed view of a semiconductor memory, wherein only some read amplifier strips 16 with a plurality of read amplifiers 17 each are plotted, and the respectively adjacent area of the memory cell fields 12 arranged between the read amplifier strips 16 are illustrated. Of two next-neighbor read amplifier strips each, bit lines connected to the respective read amplifiers lead across the memory cell fields 12 arranged between the two read amplifier strips 16, wherein the bit lines connected to both read amplifier strips 16 intermesh alternatingly and in a comb-shaped structure. Thus, every other bit line is connected to a read amplifier of the one read amplifier strip, and each remaining bit line is connected to a read amplifier of the other read amplifier strip. The illustrated arrangement corresponds to the open bit line concept, wherein the two bit lines connected to a read amplifier lead away from the read amplifier into opposing directions and thus belong to two different memory cell fields arranged at opposing sides of the read amplifier strip. This may, for example, be seen with reference to the two bit lines connected to the bottom read amplifier 17 of the middle read amplifier strip 16 in FIG. 3. This read amplifier is exemplarily illustrated in FIG. 3A in an enlarged way. The enlargement not only shows the read amplifier 17, but also a short section of the connected bit lines 13. The setup of a read amplifier and other circuits in the read amplifier strip 16 is actually known.

FIG. 4 shows a first implementation of an embodiment of a semiconductor memory, wherein in FIG. 4 one of the outer read amplifier strips 16 is illustrated, i.e., 16a. Also the read amplifiers 17 are schematically illustrated with a first and a second input terminal 18, 19 each. In FIG. 4, right of the read amplifier strip 16a, a section of a memory cell field 12 is illustrated, whose bit lines are connected to the read amplifiers 17 of the read amplifier strip 16a and to those of a further second outermost read amplifier strip 16 which is not illustrated anymore in FIG. 4. One of the memory cells 15 of the memory cell field 12 is illustrated at the top right in FIG. 4 in an enlarged view; it is a typical DRAM memory cell having a memory capacitor and a selection transistor 42 whose gate electrode is connected to the respective word line 14 and whose first source/drain area is connected to the respective bit line 13. Via the bit line 13, the memory cell 15 is, for example, connected to a read amplifier 17 of the read amplifier strip 16a.

In the embodiment, on the left side of the outer read amplifier strip 16a no further memory cell field with half the memory cell density is located, but instead a reference circuit field 1 with a plurality of reference circuit elements 3 and a plurality of reference lines 2 is provided. The reference lines 2 are connected to the read amplifiers 17 of the outer read amplifier strip 16a, i.e., to its second input terminals 19. For example, to each reference line 2, a plurality of reference circuit elements 3 is connected. According to the embodiment of FIG. 4, at each reference line respectively identical reference circuit elements 3 are located. The reference lines 2 are clearly shorter than the bit lines 13 which run within the memory cell field 12 and are only partially illustrated; the reference lines 2 only serve for imitating the electric performance of a bit line, but not to be able to store digital information or to pass on the same to the read amplifier for reading out. The reference lines 2 are pure dummy lines with regard to their capacity for storing digital information which imitate the presence of a complementary bit line at every second read amplifier input 19, which is actually not present, however. The reference lines 2 thus enable the proper operation of a read amplifier strip 16a with a plurality of read amplifiers 16 even in an area range which is only surrounded by bit lines on one side of the memory cell field. A proper operation of read amplifiers 17, like in FIG. 4, with bit lines which are only arranged and connected on one side of the read amplifier 17, is conventionally neither known nor possible. Usually, on both sides of each functional read amplifier strip, one memory cell field each having a respectively identical bit line length has to be provided. With this implementation, however, the reference lines 2 may be substantially shorter than the bit lines 13 of the oppositely arranged memory cell field 12. For example, the reference lines 2 may have a conductive trace length which is at most about 2.5 to about 10 percent of a typical bit line 13 length and which, for example, only extends over a distance which corresponds to bit line section to which, for example, between three and twenty-five, and in particular between five and ten memory cells of a regular cell field are connected. Accordingly, only few reference circuit elements 3 are necessitated per reference line 2.

In the exemplary embodiment of FIG. 4, to each reference line 2 exactly three reference circuit elements are connected. The reference circuit elements 3, according to FIG. 4, are, for example, memory cell-like circuits whose transistors 41 and capacitors are in particular implemented in the same construction as with the memory cells 15 of the memory cell fields 12. Alternatively, they may, however, also be implemented in another way. For example, the transistors 41 may be arranged like logic transistors in the periphery of the semiconductor memory 10, i.e., in its logic area. The logic transistors 41 which are provided in an identical construction also in the reference circuit elements 3, are, for example, substantially larger and less space-saving than the selection transistors 42 of the memory cells of a memory cell field (see FIG. 4 top right). Alternatively or additionally, also the capacitors which are provided in the reference circuit elements 3 may be implemented and setup in another way than those of the memory cells 15.

In the reference circuit field 1, in addition to the reference lines 2 still further conductive traces 30 are provided. In FIG. 4 and in the following embodiments, different types of further conductive traces 30 are described depending on what type of reference circuit element 3 the further conductive traces 30 are connected to each. Independent of the type of the respective reference circuit elements 3 and the conductive traces 33, the further conductive traces 30 are generally in parallel to a second direction y and thus parallel to the word lines 14 of the memory cell fields 12. In the example of FIG. 4, the further conductive traces 30 are, for example, third conductive traces 33 which are connected to gate electrodes 35a of first transistors 35, wherein the first transistors 35 are implemented in an identical design to the selection transistors of the memory cell fields. Alternatively, however, they may also be implemented like the logic transistors 41 of a logic or periphery area of the semiconductor memory 10. The further conductive traces 30 and/or 33 may be electrically biased, for example, with a third potential V which may be identical for all further conductive traces 30. Alternatively, however, also some or all of the further conductive traces 30 may be biased with different potentials, as it is exemplarily illustrated with reference to the potentials V, V' and V'''. In contrast to the word lines 14 of the memory cell field 12, however, the potential for biasing the respective further conductive trace 30 is not continuously changed during the operation of the semiconductor memory, in particular not with a frequency which corresponds to the frequency of reading out a certain memory cell or any memory cell. Instead, in the operation of the semiconductor memory, the potential for biasing the respective further line 30 is maintained constant, in order to simulate the performance of a fictitious bit line with the help of the reference line 2, the reference circuit elements 3 connected thereto and the further conductive trace 30 also connected to the reference circuit elements 3 at any point in time. The potentials for biasing the respective further conductive trace 30 may all be different from each other. The reference circuit elements 3 of the embodiment of FIG. 4 are mainly capacitive reference circuit elements 5 which, however, have a substantially greater capacity than a normal memory cell 15 of a memory cell field 12. For example, the capacity may be greater than that of a memory cell by a factor of 2 to 10. Thus, using only a few reference circuit elements 3 any memory cells connected to a bit line may be simulated.

Figure 5:
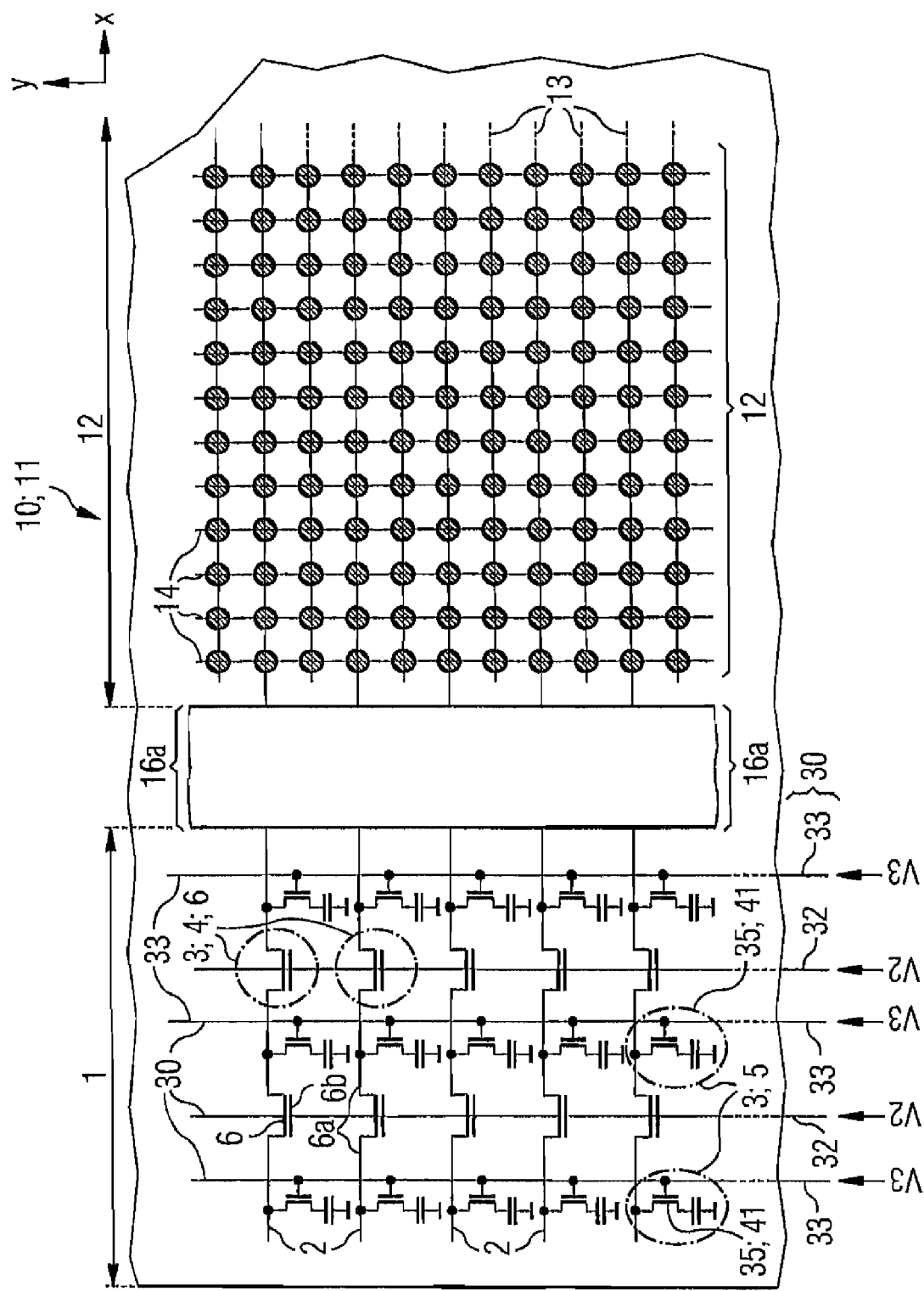
FIG. 5 shows a second embodiment of a semiconductor memory according to a further embodiment.

FIG. 5 shows a further embodiment, in which the reference circuit field 1 comprises two different types of reference circuit elements 3, i.e., for example, resistive reference circuit elements 4 in the form of a field-effect transistor which is integrated in a respective reference line, the transistor having a channel area representing an additional ohmic resistance along the course of the reference line 2, and capacitive reference circuit elements 5. The capacitive reference circuit elements 5 may, for example, be implemented as illustrated in FIG. 4. According to the embodiment of FIG. 5, per reference line 2, two resistive reference circuit elements 4 and exactly three capacitive reference circuit elements 5 each are provided, i.e., for example, in an alternating order along the course of the respective reference line 2. In FIG. 5, the respective read amplifiers in the read amplifier strip 16a are not illustrated individually; in this regard, FIG. 5 and the following figures each resemble FIG. 4. On the left side of the outer read amplifier strip 16 again a section of a memory cell field 12 is illustrated, i.e., of a first or last memory cell field along a first direction x. In the reference circuit field 1, the resistive reference circuit elements 4 each are field-effect transistors having two source/drain areas 6a, which are connected to respectively different sections of the respective reference line 2 and between which a transistor channel may be formed. For this purpose, the respective transistor 6 is switched into a conductive state via a respective further line 30. The gate electrode 6b of the respective transistor 6 is connected to the respective further conductive trace 30. All in all, in FIG. 5, however, two different types of further conductive traces 30 are illustrated, i.e., third conductive traces 33 and second conductive traces 32, to which the resistive circuit elements 4, i.e., the transistors 6 with their gate electrode 6b, are connected. By a suitable construction and dimensioning of the resistive and capacitive elements 4, 5 and suitable second and third potentials V2, V3 for permanently biasing the second conductive traces 32 and third conductive traces 33, the electric performance of the reference lines 2 is, as if a bit line having the same bit line length as a bit line 13 of a memory cell field 12 was connected to the respective read amplifier 17 of the read amplifier strip 16a. Also in FIG. 5, in the reference circuit field 1 no readable memory information is stored. The width of the reference circuit field 1 along the first direction x, however, is substantially smaller than the extension of a memory cell field 12 or the extension of half of a memory cell field 12 along the first direction x. Thus, substrate area is gained.

Figure 6:
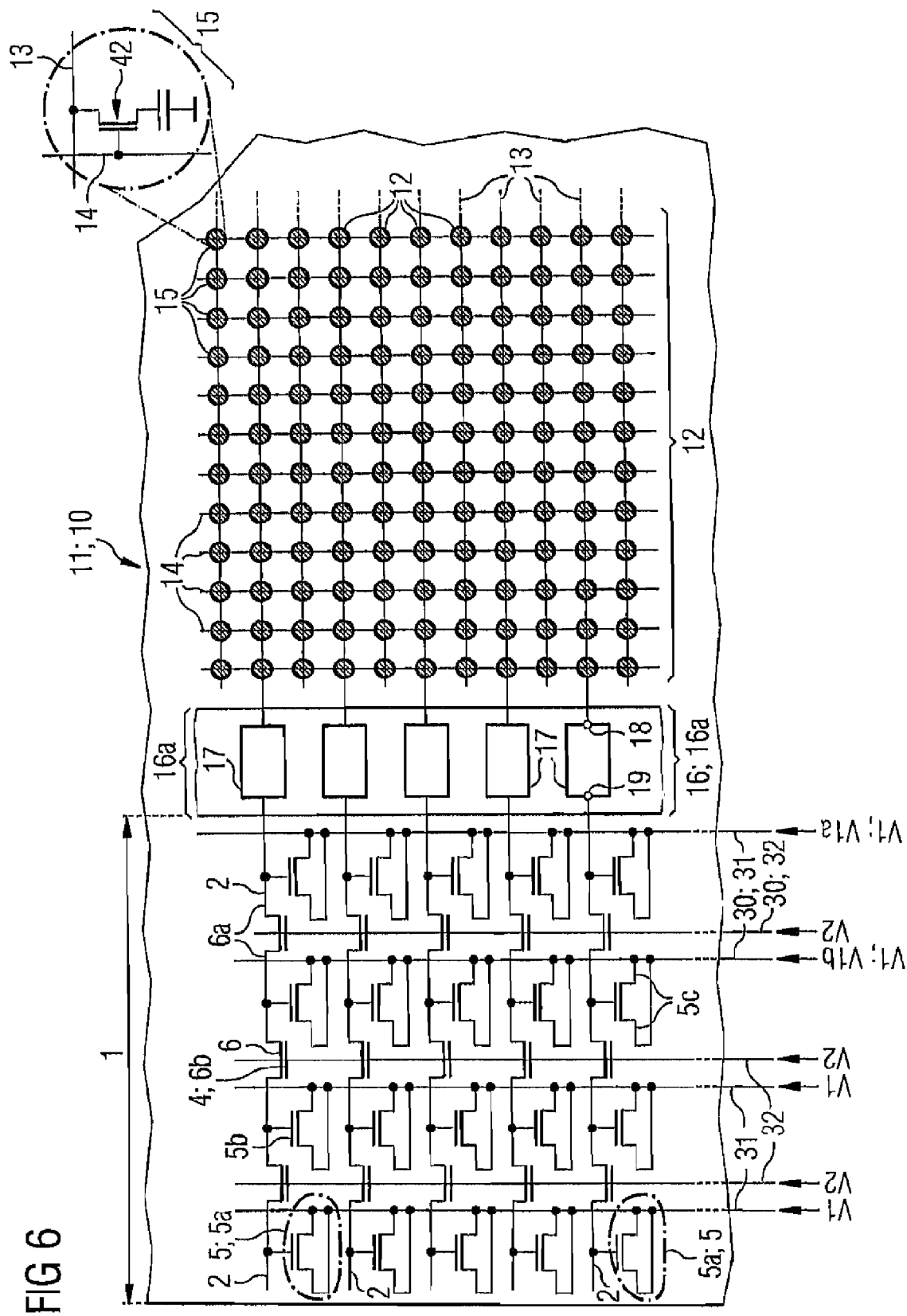
FIG. 6 shows a third embodiment of a semiconductor memory according to a further embodiment.

FIG. 6 shows a further embodiment of a semiconductor memory, wherein in the respective reference circuit field 1 also two different types of reference circuit elements 3 are provided and connected to the reference lines 2. Varactors 5a are provided as capacitive reference circuit elements 5, respectively comprising a gate electrode 5b by which they are connected to the respective reference line 2 which leads to the read amplifier strip 16a. The varactors have two source/drain electrodes 5c which are short circuited with each other, using the respective varactor 5a which is connected to a further conductive trace 30. Apart from that, in the embodiment of FIG. 6, again transistors 6 are provided as resistive reference circuit elements 4, whose two source/drain areas are connected to respectively different, successive sections of the respective reference line 2. The gate electrodes 6b of the transistors 6 are also connected to further conductive traces 30. For the varactors 5a and the transistors 6 further conductive traces 30 each are provided, i.e., first conductive traces 31 for the varactors 5a and second conductive traces 32 for the transistors 6.

As it is exemplarily illustrated in the embodiment of FIG. 6, the different circuit elements may be connected to the respective reference lines in an alternating order. Accordingly, along the first direction x the first conductive traces 31 and the second conductive traces 32 alternate. The further conductive traces 30 and/or 31, 32 are permanently biased with a (in particular permanently applied) temporally unchanged bias voltage of a suitable magnitude with the help of E-fuses or E-antifuses. For different reference circuit elements 5a, 6, different electric potentials may be applied to the respective reference lines 31, 32, for example, a first potential V1 for the varactors 5a connected to the first conductive traces 31 and a second potential V2 which is different from the first potential for the transistors 6 connected to the second conductive traces 32. Just like with the remaining figures, the reference lines 2 may end after only a few reference circuit elements, wherein the number of reference circuit elements per reference line may, for example, be between 1 and 10, and in particular between 2 and 5.

FIG. 7 shows embodiment, wherein in the reference circuit field three different types of reference circuit elements are provided, i.e., first of all capacitive reference elements 5 having transistors 35 whose gate electrodes 35a are connected to third conductive traces 33. Further, varactors 5a are provided which are connected to second conductive traces 31, which short circuit respectively both source/drain areas with each other and form a counter electrode to the respective gate electrode, and which are connected to the respective reference line 2. Finally, transistors 6 are provided as resistive reference circuit elements 4, whose source/drain areas 6a are connected to portions of the respective reference line 2. To the further conductive traces 30 and/or 31, 32, 33, different potentials may be applied, for example, uniformly depending on the type of the respectively connected reference circuit elements 3. Thus, for example, each first conductive trace is biased with a first potential V1, each second conductive trace 32 with a second potential V2 and each third conductive trace 33 with a third potential V3. Further, also for conductive traces 30 each having the same type of connected reference circuit elements 5a, an individually given bias voltage may be applied each, as illustrated in the case of the potentials V1a and V1b.

The transistors 6 of FIGS. 5 to 7 may be implemented like logic transistors of a logic or peripheral area of the semiconductor memory 10. The transistors, which are now provided in an identical construction also in the reference circuits 3, are larger and less space-saving than the selection transistors 42 of the memory cells of a memory cell field, may, however, also be used in the memory cell fields according to this embodiment.

Independent of the respective type and number of reference circuits 3 per reference line 2, however, the reference circuit elements enable to connect reference lines 2 to the second input terminal 19 of the read amplifiers 17, whose conductive trace length is substantially shorter than the conductive trace length of the bit lines 13 in the memory cell fields 12. Thus, on the outer side of the outer read amplifier strips 16a, 16b substrate area is saved, whereby the package density of the memory cells on a substrate of the semiconductor memory may be increased, for example, by between about two and about eight percent.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. A semiconductor memory comprising:
    a plurality of read amplifier strips, each strip comprising a plurality of read amplifiers; and
    a plurality of memory cell fields, each memory cell field comprising bit lines and memory cells connected to the bit lines,
    wherein the plurality of read amplifier strips comprises at least two outer read amplifier strips, between which the remaining read amplifier strips and the memory cell fields are arranged,
    wherein a reference circuit field comprising reference lines and reference circuit elements connected thereto is arranged next to at least one of the outer read amplifier strips, and
    wherein the reference lines are shorter than the bit lines of the memory cell fields.

2. The semiconductor memory according to claim 1, wherein each reference line implemented in the same way as a readable memory cell connects at least one reference circuit element to a read amplifier of the respective outer read amplifier strip.

3. The semiconductor memory according to claim 1, wherein the reference lines each connect at least one reference circuit element to a respective read amplifier of the respective outer read amplifier strip.

4. The semiconductor memory according to claim 1, wherein each read amplifier of the at least two outer read amplifier strips comprises a first input terminal to which a bit line is connected, and a second input terminal to which a reference line is connected, wherein the respective read amplifier detects and amplifies a potential difference between the first and second input terminals.

5. The semiconductor memory according to claim 1,
wherein the read amplifier strips and the memory cell fields are lined up in an alternating order along a first direction, wherein the bit lines and the reference lines run along the first direction,
wherein one memory cell field each, whose bit lines are connected to read amplifiers of the at least two read amplifier strips adjacent to the memory cell field, is arranged between two read amplifier strips each.

6. The semiconductor memory according to claim 1, wherein the semiconductor memory comprises two outer read amplifier strips, which comprise a first read amplifier strip arranged along a first direction and a last read amplifier strip arranged along the first direction.

7. The semiconductor memory according to claim 6, wherein one reference circuit field each is arranged both adjacent to the first read amplifier strip and adjacent to the last read amplifier strip.

8. The semiconductor memory according to claim 1, wherein each reference circuit field is free from readable memory cells.

9. The semiconductor memory according to claim 1, wherein each reference circuit field comprises a width along a first direction, which is smaller than half of the width of a memory cell field along the first direction, wherein the reference lines comprise a length, which is at most half as long as the length of the bit lines of the memory cell fields.

10. The semiconductor memory according to claim 1, wherein the reference lines comprise a conductive trace length, which is at most 10 percent, as long as the conductive trace length of the bit lines of the memory cell fields.

11. The semiconductor memory according to claim 1, wherein one or several reference circuit elements each are connected to the reference lines, which imitate the electric performance, of a bit line.

12. The semiconductor memory according to claim 1, wherein the reference circuit fields comprise dummy memory cells to which the semiconductor memory allocates no memory address.

13. The semiconductor memory according to claim 1, wherein a conductive trace length of the reference lines corresponds to a bit line section which extends across at most 25.

14. The semiconductor memory according to claim 1, wherein the plurality of memory cell fields comprises two outermost memory cell fields, each of which is surrounded by two read amplifier strips.

15. The semiconductor memory according to claim 1, wherein a memory cell area comprises a number N of memory cell fields and a number N+1 of read amplifier strips.

16. The semiconductor memory according to claim 1, wherein one or several resistive reference circuit elements and/or capacitive reference circuit elements are each connected to the reference lines.

17. The semiconductor memory according to claim 1, wherein at least two reference circuit elements comprising a different construction are connected to each reference line.

18. The semiconductor memory according to claim 1, wherein the reference circuit elements are connected to the reference lines and to further conductive traces.

19. The semiconductor memory according to claim 18, wherein the further conductive traces run along a second direction, which is different from a direction along which the reference lines run.

20. The semiconductor memory according to claim 18, wherein the memory cell fields comprise a plurality of word lines whose potential is changed by the semiconductor memory when reading out a memory cell, and wherein the semiconductor memory biases each of the further conductive traces of the reference circuit field with a respective potential, which remains temporally constant during reading out any memory cell of any memory cell field.

21. The semiconductor memory according to claim 1, further comprising capacitive reference circuit elements connected to the reference lines.

22. The semiconductor memory according to claim 21, wherein the capacitive reference circuit elements comprise varactors, the varactors comprising one gate electrode, which is connected to the respective reference line, and two source/drain electrodes of which at least one source/drain electrode is connected to a further conductive trace and may be biased via a further conductive trace.

23. The semiconductor memory according to claim 1, further comprising resistive reference circuit elements connected to the reference lines.

24. The semiconductor memory according to claim 23, wherein the resistive reference circuit elements comprise transistors comprising two source/drain areas, between which a transistor channel is formed, wherein the two source/drain areas are connected to different portions of the reference line.

25. The semiconductor memory according to claim 24, wherein each transistor comprises a gate electrode, which is connected to further conductive traces.

26. The semiconductor memory according to claim 18, wherein the further conductive traces are biased by the semiconductor memory with temporally constant electric potentials.

27. The semiconductor memory according to claim 18, wherein the further conductive traces comprise first conductive traces, wherein capacitive reference circuit elements are connected to the first conductive traces.

28. The semiconductor memory according to claim 18, wherein the further conductive traces comprise second conductive traces, wherein resistive reference circuit elements are connected to the second conductive traces.

29. The semiconductor memory according to claim 18, wherein the further conductive traces comprise third conductive traces, wherein gate electrodes of first transistors are connected to the third conductive traces.

30. The semiconductor memory according to claim 29, wherein the semiconductor memory comprises a memory area and a logic area comprising logic transistors, wherein transistors connected to the third conductive traces are implemented with the same construction as logic transistors and/or are implemented to be larger than selection transistors of the memory cells of the memory cell fields.

31. The semiconductor memory according to claim 18, wherein the further conductive traces comprise fourth conductive traces, wherein gate electrodes of second transistors are connected to the fourth conductive traces, and wherein second transistors are implemented with the same construction as selection transistors of the memory cells of the memory cell fields.

32. The semiconductor memory according to claim 31, wherein the fourth conductive traces supply gate electrodes of the second transistors with time-independent, constant electric potentials during the operation of the semiconductor memory.

33. The semiconductor memory according to claim 18, wherein the further conductive traces are biased by the semiconductor memory with time-independent potentials, whose magnitude depends on the type of reference circuit elements, which are connected to the respective further conductive trace.

34. The semiconductor memory according to claim 18, wherein the semiconductor memory permanently biases the further conductive traces with different electric potentials, depending on the type of connected reference circuit elements.

35. The semiconductor memory according to claim 18, wherein the semiconductor memory permanently biases at least some of the further conductive traces with different potentials, wherein one each of the reference circuit elements, which comprise the same construction, is connected to the same.

36. The semiconductor memory according to claim 18, wherein the further conductive traces intersect the reference lines and/or run in parallel to the word lines of the memory cell fields.

37. The semiconductor memory according to claim 18, wherein each reference circuit field comprises a number of further conductive traces, which is at most a quarter of the number of word lines per memory cell field.

38. The semiconductor memory according to claim 1, wherein the semiconductor memory is a volatile read-write memory.

* * * * *